(12) United States Patent
Howe et al.

(10) Patent No.: US 11,031,083 B2
(45) Date of Patent: Jun. 8, 2021

(54) APPARATUSES AND METHODS FOR DECODING ADDRESSES FOR MEMORY

(71) Applicant: MICRON TECHNOLOGY, INC., Boise, ID (US)

(72) Inventors: Gary L. Howe, Allen, TX (US); Scott E. Smith, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 74 days.

(21) Appl. No.: 16/249,714

(22) Filed: Jan. 16, 2019

(65) Prior Publication Data

US 2020/0227118 A1  Jul. 16, 2020

(51) Int. Cl.
G11C 8/00 (2006.01)
G11C 16/08 (2006.01)
G11C 7/06 (2006.01)
G11C 8/10 (2006.01)

(52) U.S. Cl.
CPC .............. *G11C 16/08* (2013.01); *G11C 7/06* (2013.01); *G11C 8/10* (2013.01); *G11C 2207/061* (2013.01)

(58) Field of Classification Search
CPC ......... G11C 29/70; G11C 17/16; G11C 17/18; G11C 11/41
USPC .................................................. 365/230.06
See application file for complete search history.

(56) References Cited

U.S. PATENT DOCUMENTS

| | | | | |
|---|---|---|---|---|
| 2005/0185482 A1* | 8/2005 | Sugimoto | ............... | G11C 29/81 365/200 |
| 2008/0259701 A1* | 10/2008 | Gajjewar | ............... | G11C 29/808 365/200 |
| 2008/0291766 A1* | 11/2008 | Bessho | ................... | G11C 7/18 365/230.03 |
| 2009/0196108 A1* | 8/2009 | Kambara | ............. | G11C 29/846 365/189.05 |

\* cited by examiner

*Primary Examiner* — Hoai V Ho
*Assistant Examiner* — Minh Dinh
(74) *Attorney, Agent, or Firm* — Dorsey & Whitney LLP (57) ABSTRACT

Apparatuses and methods for decoding addresses for memory are disclosed. An example apparatus includes a memory cell array and a row decoder. The memory cell array includes a bank of memory including a plurality of groups of memory. Each of the groups of memory includes sections of memory, and each of the sections of memory including memory cells arranged in rows and columns of memory. The row decoder decodes addresses to access a first group of memory to include rows of prime memory from a first block of memory and to include rows of prime memory from a second block of memory. The row decoder decodes the addresses to access a second group of memory to include rows of prime memory from the second block of memory and to include rows of redundant memory. The rows of redundant memory are shared with the first and second blocks of memory.

19 Claims, 4 Drawing Sheets

APPARATUSES AND METHODS FOR DECODING ADDRESSES FOR MEMORY

BACKGROUND

Semiconductor memory are used in many electronic systems to store data. An example of semiconductor memory is dynamic random access memory (DRAM). Semiconductor memories include a memory array having memory cells in which the data may be stored. The memory cells are typically organized and accessed as rows and columns of memory cells, with each memory cell associated with an intersection of a row and column. Memory cells are accessed by decoding memory addresses which are received by the memory and decoded by decoder circuits included in the memory.

The decoder circuits decode the memory addresses and access the memory cells according to a physical arrangement of the memory array. Memory arrays are typically arranged to facilitate binary address decoding, with banks and sections of memory cells laid out along binary numbers of rows and columns. Additionally, the memory arrays may be arranged to facilitate other operations of the memory. For example, the arrangement of memory arrays may facilitate testing of the memory array, memory cell refresh operations needed to maintain data integrity, accessing redundant memory used to repair defective memory cells, as well as other operations.

Arranging memory arrays to facilitate binary address decoding, however, limits flexibility when designing the memory array. For example, limiting banks and/or sections of memory to include binary numbers of rows and/or columns of memory may result in a physical arrangement that produces poor layout area efficiency or compromises performance (e.g., slower memory cell access time, relatively higher power consumption, etc.) due to electrical characteristics inherent in the semiconductor structures of the memory array, such impedance of conductive lines of the memory array.

Thus, it may be desirable, to provide memory address decoding that allows for flexible arrangements of banks and/or sections of memory arrays and may facilitate operations of the memory.

DETAILED DESCRIPTION

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
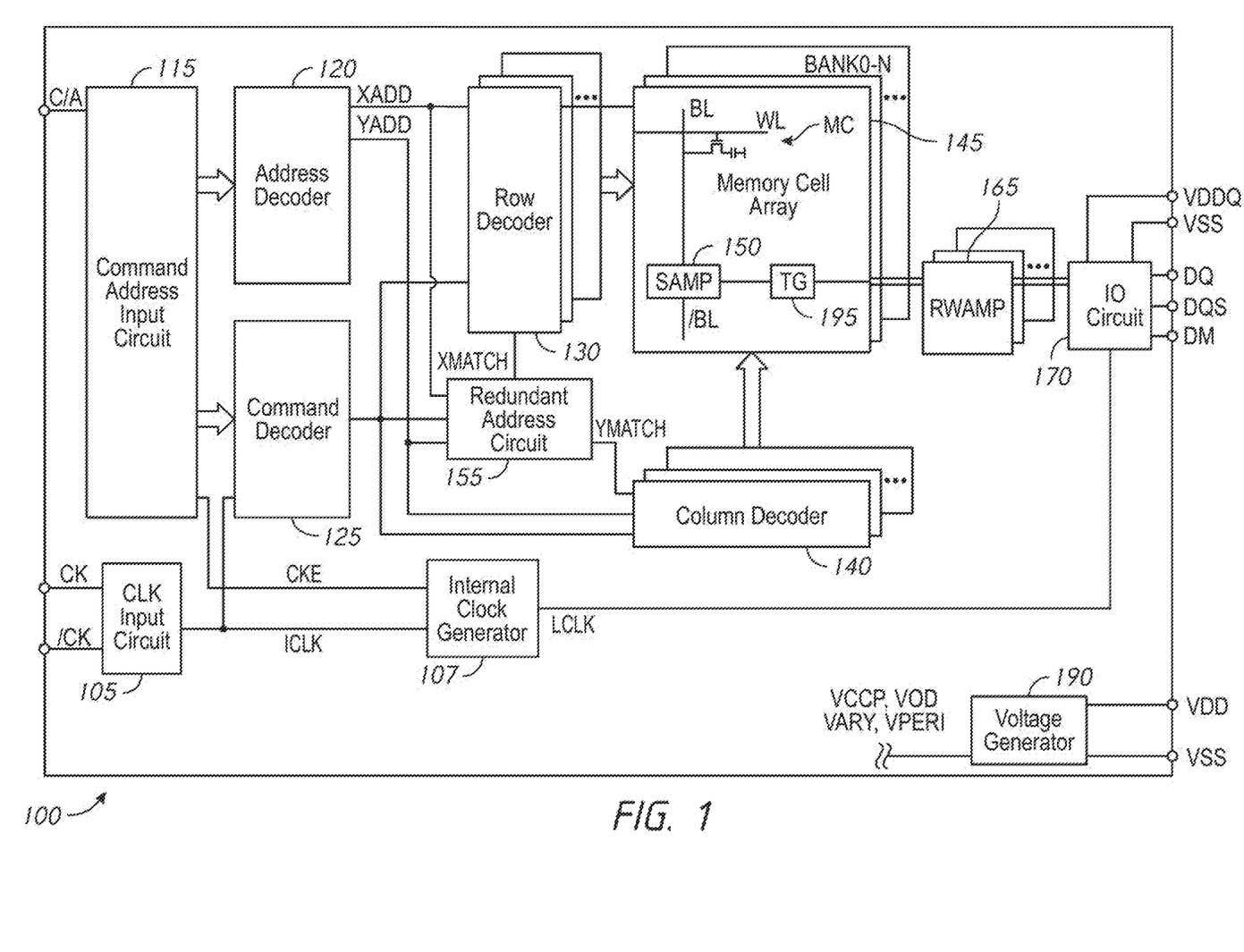
FIG. 1 is a schematic block diagram of a semiconductor device according to an embodiment of the disclosure.

FIG. 1 is a schematic block diagram of a semiconductor device 100, in accordance with an embodiment of the present disclosure. The semiconductor device 100 may include a clock input circuit 105 an internal clock generator 107, an address command input circuit 115, an address decoder 120, a command decoder 125, a plurality of row (e.g., first access line) decoders 130, a memory cell, array 145 including sense amplifiers 150 and transfer gates 195, a plurality of column (e.g., second access line) decoders 140, a plurality of read/write amplifiers 165, an, input/output (I/O) circuit 170, and a voltage generator 190. The semiconductor device 100 may include a plurality of external terminals including address, and command terminals coupled to command/address bus, clock terminals CK and /CK, data terminals DQ, DQS, and DM, and power supply terminals VDD, VSS, and VDDQ. The terminals and signal lines associated with the command/address bus may include a first set of terminals and signal lines, that are configured to receive the command signals and a separate, second set of terminals and signal lines that configured to receive the address signals, in some examples. In other examples, the terminals and signal lines associated with the command and address bus may include common terminals and signal lines that are configured to receive both command signal and address signals. The semiconductor device may be mounted on a substrate, for example, a memory module substrate, a motherboard or the like.

The memory cell array 145 includes a plurality of banks of memory BANK0-N, where N is a positive integer, such as 3, 7, 15, 31, etc. Each bank of memory BANK0-N may include a plurality of word lines WL, a plurality of digit lines DL, and a plurality of memory cells MC arranged at intersections of the plurality of word lines WL and the plurality of digit lines DL. The plurality of memory cells are arranged in rows of memory corresponding to the plurality of word lines and in columns of memory corresponding to the digit lines. The selection of the word line WL for each bank of memory BANK0-N is performed by a corresponding row decoder 130 and the selection of the digit line DL is performed by a corresponding column decoder 140. The plurality of sense amplifiers 150 are located for their corresponding digit lines DL and coupled to at least one respective local I/O line further coupled to a respective one of at least two main I/O line pairs, via transfer gates TG 195, which function as switches. The sense amplifiers 150 and transfer gates TG 195 may be operated based on control signals from decoder circuitry, which may include the address decoder 120, the row decoders 130, the column decoders 140, any control circuitry of the memory cell array 145 of the banks of memory BANK0-N, or any combination thereof. In some examples, the tRCD for the semiconductor device 100 may involve operations of the row decoders 130, the column decoders 140, and circuitry of the memory cells array 145 of each of the plurality of banks of memory BANK0-N (e.g., including the plurality of sense amplifiers 150 and the transfer gates TG 195).

In some examples, the plurality of sense amplifiers 150 may include threshold voltage compensation circuitry that compensates for threshold voltage differences between components of the sense amplifiers 150. Compensating for threshold voltage Vt differences between circuit components within the sense amplifier 150 may mitigate effects of small variances in the performance between circuit components of the sense amplifiers 150 (e.g., due to process, voltage, and temperature (PVT) variance) and improve reliability.

The command/address input circuit 115 may receive an address signal and a bank address signal from outside at the command/address terminals via the command/address bus and transmit the address signal and the bank address signal to the address decoder 120. The address decoder 120 may decode the address signal received from the address/command input circuit 115 and provide a row address signal XADD to the row decoder 130, and a column address signal YADD to the column decoder 140.

The command/address input circuit 115 may receive a command signal from outside, such as, for example, a memory controller at the command/address terminals via the command/address bus and provide the command signal to the command decoder 125. The command decoder 125 may decode the command signal and generate various internal command signals. The internal command signals may be used to control operation and timing of various circuits of the semiconductor device 100. For example, the internal command signals may include row and column command signals to control circuits to perform access operations to selected word lines and digit lines, such as a read command or a write command.

Accordingly, when a row activation command is issued and a bank address and row address are timely supplied with the activation command, and a column address is timely supplied with a read command, read data is read from a memory cell in the memory cell array 145 designated by the row address and the column address.

The read/write amplifiers 165 may receive the read data DQ and provide the read data DQ to the IO circuit 170. The IO circuit 170 may provide the read data 130 to outside via, the data terminals DQ, DQS and DM together with a data strobe signal at DQS and a data mask signal at DM. Similarly, when the row activation command is issued and a bank address and row address are timely supplied with the activation command, and a column address is timely supplied with a write command, the input/output circuit 170 may receive write data at the data terminals DQ, DQS, DM, together with a data strobe signal at DQS and a data, mask signal at DM and provide the write data via the read/write amplifiers 165 to the memory cell array 145. Thus, the write data may be written in the memory cell designated by the row address and the column address.

To help ensure the reliability of the semiconductor device 100, memory cells of the memory cell array 145 are tested to detect defective cells. Typically, to repair a row or column of memory (e.g., row or column of prime memory), the memory cell array 145 may include rows and columns of redundant memory that can be swapped for a defective row or column of memory, respectively. In order to maintain which rows or columns have been replaced, the semiconductor device 100 may include the redundant address circuit 155.

The redundant address circuit 155 may include circuitry that is configured to store row addresses and column addresses that correspond to rows or columns of prime memory that have been determined to be defective. The redundant address circuit 155 may also include circuitry that compares the row address XADD with stored defective row addresses (e.g., and/or compares the column address YADD with stored defective column addresses) to detect a match.

The redundant address circuit 155 may provide an active XMATCH signal to the row decoder 130 in response to detecting that a memory rows associated with the row address XADD is defective based on the comparison and may provide an active YMATCH to the column decoder 140 in response to detecting that a memory column associated with the column address YADD is defective based on the comparison.

In response to the active XMATCH signal, the row decoder 130 may redirect the row address XADD to a replacement row address associated with a row of redundant memory in the memory cell array 145 when performing previously discussed operations. Similarly, in response to the active YMATCH signal, the column decoder 140 may redirect the column address YADD to a replacement column address associated with a column of redundant memory in the memory cell array 145 when performing previously discussed operations.

Turning to the explanation of the external terminals included in the semiconductor device 100, the dock terminals CK and /CK may receive an external clock signal and a complementary external clock signal, respectively. The external dock signals (including complementary external dock signal) may be supplied to a dock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 170. The IO circuit 170 may use the phase controller internal clock signal LCLK as a timing signal for determining an output timing of read data.

The power supply terminals may receive power supply voltages VDD and VSS. These power supply voltages VDD and VSS may be supplied to a voltage generator circuit 190. The voltage generator circuit 190 may generate various internal voltages, VCCP, VOD, VBLP, NSA_BIAS, VARY, VPERI, and the like based on the power supply voltages VDD and VSS. The internal voltage VCCP is mainly used in the row decoder 130, the internal voltages VOD, VBLP, NSA_BIAS, and VARY are mainly used in the sense amplifiers 150 included in the memory cell array 145, and the internal voltage VPERI is used in many other circuit blocks. The IO circuit 170 may receive the power supply voltages VDD and VSS. For example, the power supply voltages VDDQ and VSS may be the same voltages as the power supply voltages VDD and VSS, respectively. However, the dedicated power supply voltages VDDQ and VSS may be used for the IO circuit 170.

Figure 2:
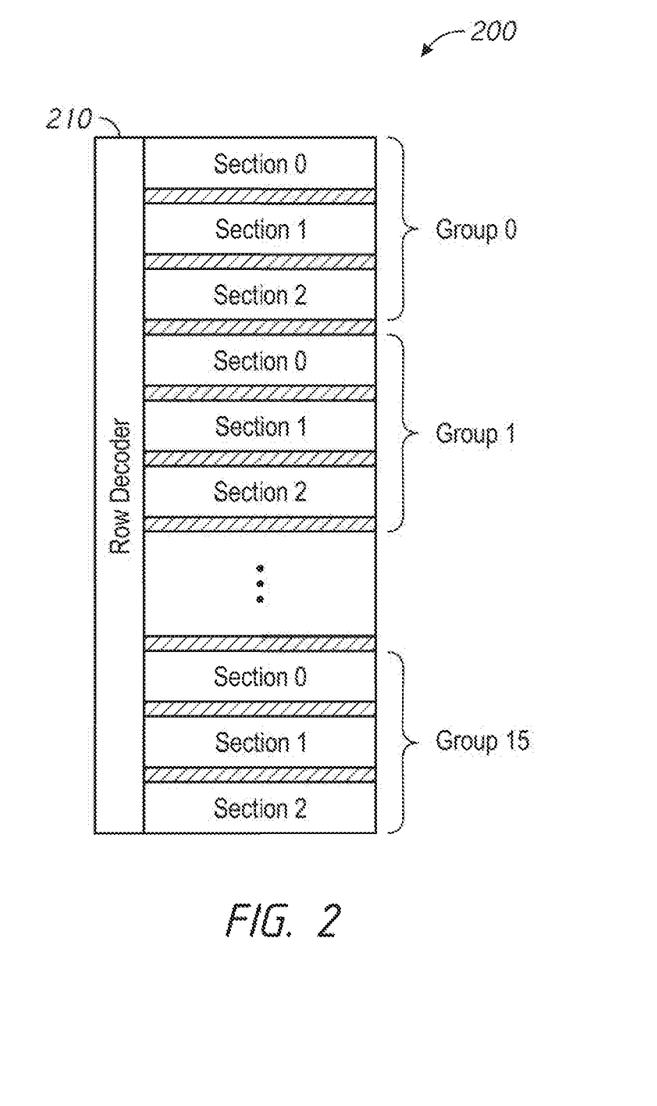
FIG. 2 is a block diagram of a bank of memory according to an embodiment of the disclosure.

FIG. 2 is a block diagram of a bank of memory 200 according to an embodiment of the disclosure. The bank of memory 200 may be included in the banks of memory of memory cell array 145 of FIG. 1, in some embodiments of the disclosure.

The bank of memory 200 includes memory cells which are arranged in rows and columns of memory with a memory cell at the intersection of a row and column. The rows and columns of memory are included in several sections of memory. The sections of memory may be grouped into groups of multiple sections of memory. Each of the sections may include the same number of rows and columns of memory in some embodiments of the disclosure. In some embodiments of the disclosure, a section of memory may include a different number of rows and/or columns of memory.

In the example shown in FIG. 2, the bank of memory 200 includes 48 sections of memory, which are grouped into 16 groups of 3 sections. The groups of the bank of memory 200 are referenced as Groups 0-15, with each Group including Sections 0-2.

In some embodiments of the disclosure, each of the sections includes a non-binary number of rows of memory. A non-binary number is a number that is other than a base-2 number. Examples of base-2 numbers are 1, 2, 4, 8, 16, 32, 64, . . . , etc. As known, binary numbers facilitate decoding of addresses to corresponding memory locations. In the example shown in FIG. 2, it is assumed that each of the sections includes 1,376 rows of memory. As a result, each Group includes 4,128 rows of memory, and the bank of memory 200 includes 66,048 rows of memory.

The rows of memory of the banks of memory are decoded by row decoder 210. The row decoder 210 may be included in the row decoder 130 of FIG. 1, in some embodiments of the disclosure. Logic circuits of the row decoder 210 decode internal addresses to selectively activate a row or rows of memory corresponding to an address to be accessed (e.g., read operation, write operation, etc.). For example, row decoder 210 may decode a portion (or portions) of the address bits of an internal row address to identify a row for activation. Sense amplifiers are included in the regions between the sections and are shown in FIG. 2 in crosshatch. The sense amplifiers may have an open digit line architecture in some embodiments of the disclosure. For example, where each of the sense amplifiers is coupled to a first digit line that extends into one section of memory and is coupled to a second digit line that extends into an adjacent section of memory. The digit lines may generally correspond to a column of memory of the sections of memory. When accessing any of the rows of memory in the sections of memory into which the digit lines extend, the sense amplifiers coupled to the digit lines are activated.

At least one of the Groups includes rows of memory that are, decoded (e.g., accessed) by the row decoder 210 as associated with a plurality of different blocks of memory. For example, in some embodiments of the disclosure, a Group includes rows of memory that are decoded as associated with a block of memory, and also includes rows of memory that are decoded as associated with another block of memory. The row decoder 210 decodes addresses to access the Group(s) to include rows of memory from more than one block of memory. Additionally, every Group does not include rows of memory that are decoded as rows of redundant memory. For example, in some embodiments of the disclosure, rows of memory that are decoded as rows of redundant memory for the bank of memory 200 are included in one of the Groups and the row decoder 210 accesses the rows of redundant memory accordingly. In some embodiments of the disclosure, the rows of redundant memory for the bank of memory 200 are included in one of the Sections. The rows of redundant memory may be used to repair defective rows of memory of the bank of memory 200 as previously described.

Figure 3:
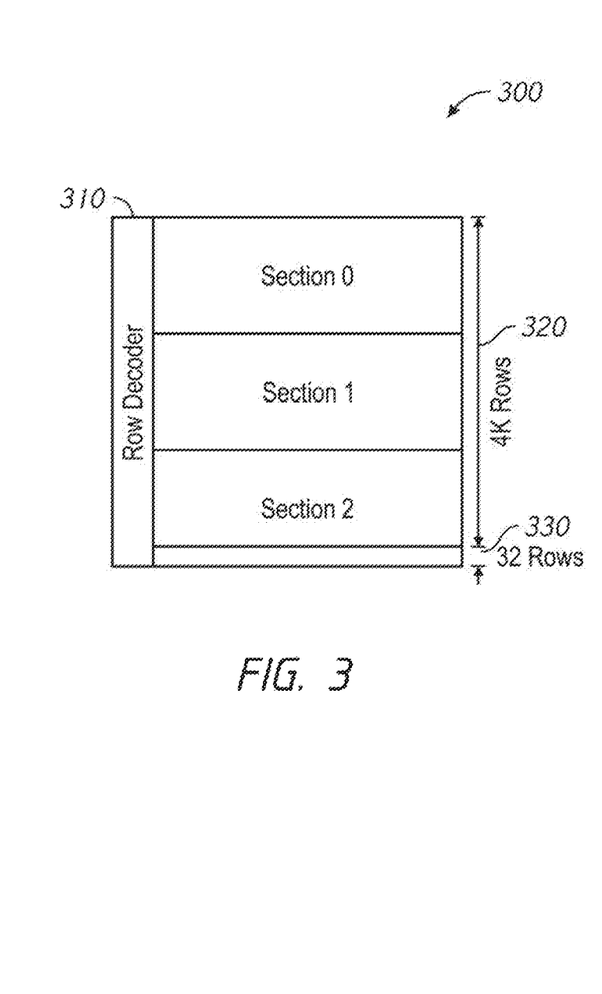
FIG. 3 is a block diagram of sections of memory included in a group of memory sections according to an embodiment of the disclosure.

FIG. 3 is a block diagram of sections of memory included in a group of memory sections Group 300 according to an embodiment of the disclosure. The group of memory sections Group 300 may be included in the bank of memory 200 of FIG. 2 and/or in the bank of memory 200 of FIG. 2 in some embodiments of the disclosure.

The Group 300 includes three sections of memory: Section 0, Section 1, and Section 2 (sense amplifiers used by Sections 0, 1, and 2 are omitted from FIG. 3). A portion of a row decoder 310 is also shown in FIG. 3. The row decoder 310 decodes internal addresses to selectively activate a row or rows of memory corresponding to an address to be accessed (e.g., read operation, write operation, etc.). The row decoder 310 may be included in the row decoder 130 of FIG. 1 and/or included in the row decoder 210 of FIG. 2, in some embodiments of the disclosure. Sense amplifiers are included in regions between Section 0 and Section 1, and between Section 1 and Section 2 (not shown in FIG. 3). Sense amplifiers may also be included in a region adjacent Section 0 that is opposite of Section 1. Sense amplifiers may be included in a region adjacent Section 2 that is opposite of Section 1.

Each of the Sections includes anon-binary number of rows of memory. Additionally, the Group 300 does not include any rows of memory that are decoded by the row decoder 310 as rows of redundant memory. However, the Group 300 includes rows of memory that are decoded as associated with a plurality of different blocks of memory. The row decoder 310 decodes the internal addresses to access the rows of memory of Group 300 as including rows of memory associated with the different blocks of memory.

In the example of FIG. 3, each of the Sections includes 1,376 rows of memory. As a result, the Group 300 includes 4,128 rows of memory. All of the 4,128 rows of memory are decoded as rows of prime memory. The Group 300 includes rows of memory that may be decoded as associated with a first block of memory, and rows of memory that may be decoded as associated with a second block of memory (not shown). In some embodiments of the disclosure, a binary number of rows of memory of the Group are associated with the first block, of memory and a binary number of rows of memory of the Group are associated with the second block of memory. For example, the 4,128 rows of memory of Group 300 may be decoded by the row decoder 310 as 4,096 rows of memory 320 (4K rows of memory) associated with the first block of memory, and as 32 rows of memory 330 associated with a second block of memory. The row decoder 310 includes logic circuits to decode internal addresses to access the rows of memory accordingly. The rows of memory associated with the second block of memory are included in one Section of Group 300. In the particular example of FIG. 3, the 32 rows of memory associated with the second block of memory are included in Section 2. The 4,096 rows of memory associated with the first block of memory are included in Section 0, Section 1, and a portion of Section 2.

Figure 4:
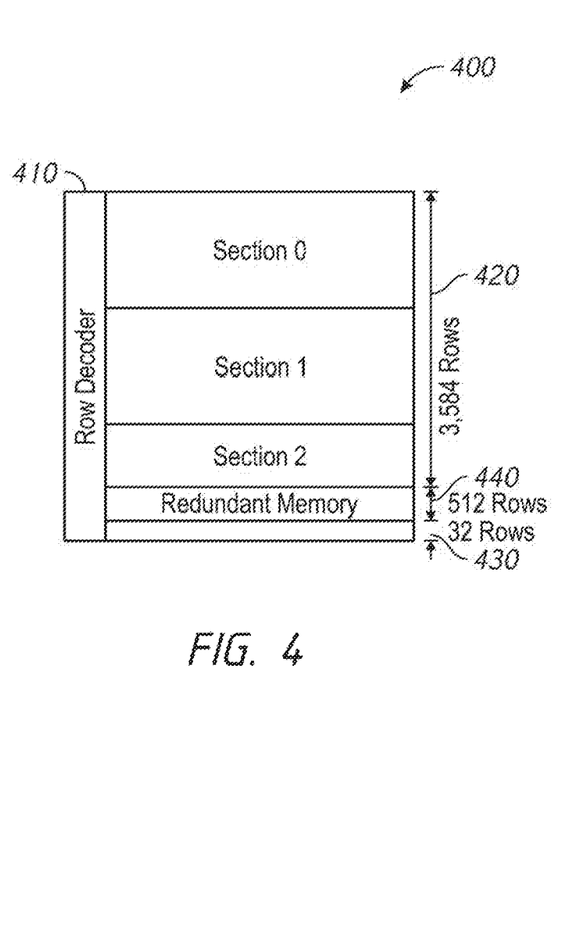
FIG. 4 is a block diagram of sections of memory included in a group of memory sections according to an embodiment of the disclosure.

FIG. 4 is a block diagram of sections of memory included in a group of memory sections Group 400 according to an embodiment of the disclosure. The group of memory sections Group 400 may be included in the bank of memory 200 of FIG. 2 and/or in the bank of memory 200 of FIG. 2 in some embodiments of the disclosure.

The Group 400 includes three sections of memory: Section 0, Section 1, and Section 2 (sense amplifiers used by Sections 0, 1, and 2 are omitted from FIG. 4). A portion of a row decoder 410 is also shown in FIG. 4. The row decoder 410 decodes internal addresses to selectively activate a row or rows of memory corresponding to an address to be accessed (e.g., read operation, write operation, etc.). The row decoder 410 may be included in the row decoder 130 of FIG. 1 and/or included in the row decoder 210 of FIG. 2, in some embodiments of the disclosure. Sense amplifiers are included in rations between Section 0 and Section 1, and between Section 1 and Section 2 (not shown in FIG. 3). Sense amplifiers may be included in a region adjacent Section 0 that is opposite of Section 1. Sense amplifiers may be included in a region adjacent Section 2 that is opposite of Section 1.

Each of the Sections includes a non-binary number of rows of memory. Additionally, the Group 400 includes rows of redundant memory. The Group 400 includes rows of memory associated with at least one block of memory. The row decoder 410 decodes the internal addresses to access the rows of memory of Group 400 as including rows of memory associated with at least one block of memory.

In the example of FIG. 4, each of the Sections includes 1,376 rows of memory. As a result, the Group 400 includes 4,128 rows of memory. The 4,128 rows of memory may be decoded by the row decoder 410 as 3,584 rows of prime memory 420 and 430, and 512 rows of redundant memory 440. The 512 rows of redundant memory 440 may be used to repair defective rows of memory of a bank of memory that includes the Group 400. The Group 400 includes rows of (prime) memory that may be decoded as associated with a block of memory. For example, the rows of memory of Group 400 may be decoded as 3,584 rows of memory 420 associated with a block of memory, and as 32 rows of memory 430 also associated with the same block of memory. The row decoder 410 includes logic circuits to accordingly decode internal addresses to access the rows of memory 420 and 430, and to access rows of, memory 440 as associated with the block of memory and as redundant memory, respectively.

The rows of redundant memory 440 are included in one Section of Group 400. The rows of memory 430 are also included in one Section of Group 400. The rows of redundant memory 440 and the rows of memory 430 may be included in the same Section. In the particular example of FIG. 4, the rows of redundant memory 440 and the rows of memory 430 are included in Section 2. The rows of memory 420 are included in Section 0, Section 1, and a portion of Section 2.

Additionally, the rows of redundant memory 440 may be included in a region that is between the rows of memory 420 and rows of memory 430. For example, the rows of redundant memory 440 are included in a region that is physically disposed between the rows of memory 420 and rows of memory 430 and/or addressed as different from the row s of memory 420 and 430 (unless an address for a row of defective memory in either rows of memory 420 or 430 has been remapped to a redundant row included in the rows of redundant memory 440).

In embodiments of the disclosure that include the rows of redundant memory in one section of memory (e.g., Section 2 of Group 400), any of the rows of redundant memory may be accessed by activating a set of sense amplifiers (e.g., sense amplifiers included in a region between Section 1 and Section 2). For embodiments of the disclosure including sense amplifier threshold voltage compensation, power consumption related to operations for accessing the rows of redundant memory may be limited to the power consumed by the activated set of sense amplifiers (e.g., performing concurrent prime memory and redundant memory sense amplifier threshold voltage compensation). In contrast, in architectures where the rows of redundant memory are spread over multiple sections of memory, multiple sets of sense amplifiers may need to be activated if any of the redundant rows are to be accessed. Activating the multiple sets of sense amplifiers may consume considerable power.

In some embodiments of the disclosure, the rows of redundant memory are included in more than one section of memory. For example, less than all groups of memory included in a bank of memory include redundant memory, each group of memory including a plurality of sections of memory.

Figure 5:
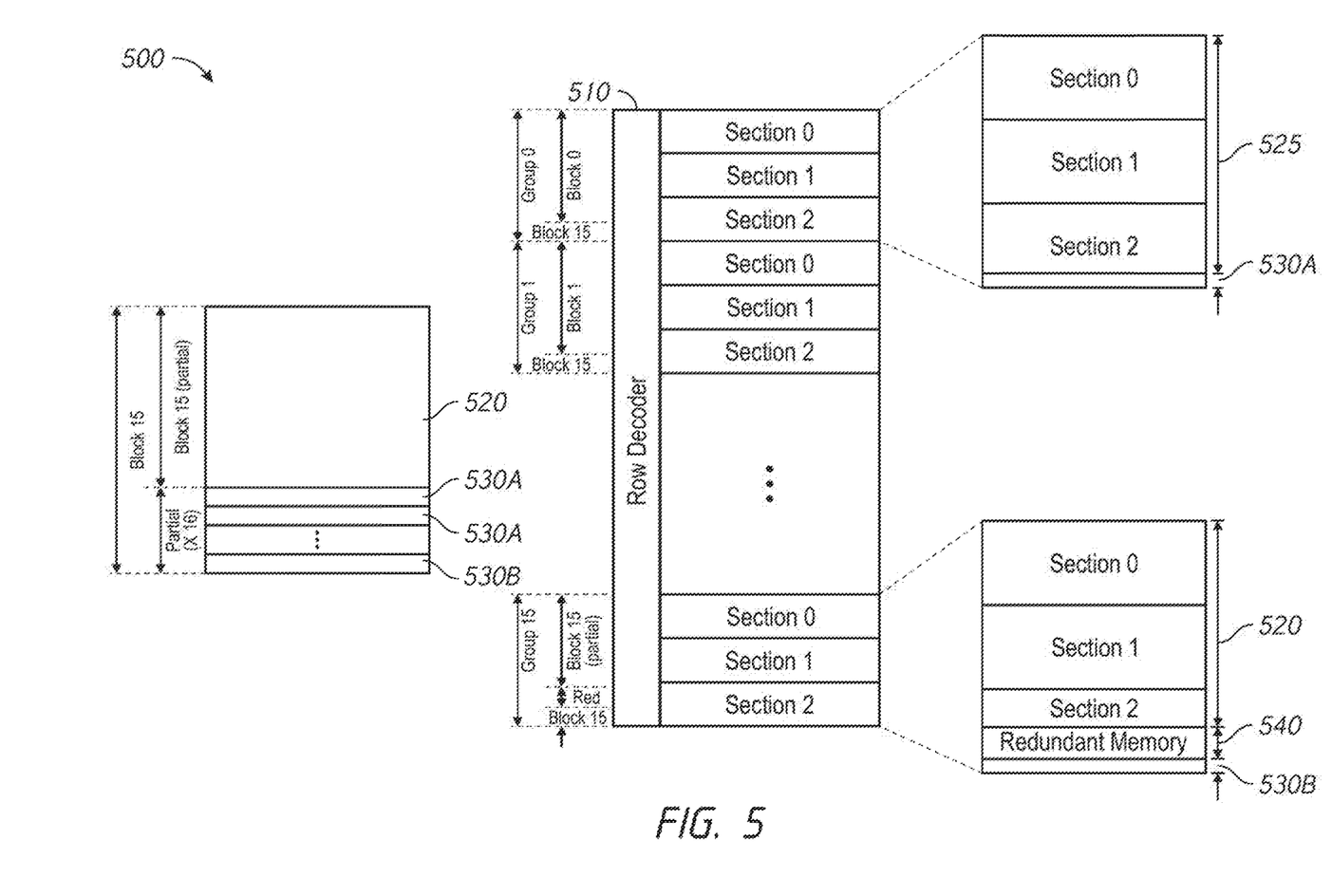
FIG. 5 is a block diagram of a bank of memory according to an embodiment of the disclosure.

In some embodiments of the disclosure, a bank of memory includes both Groups 300 and 400. For example, FIG. 5 is a block diagram of a bank of memory 500 according to an embodiment of the disclosure. The bank of memory 500 may be included in the banks of memory of memory cell array 145 of FIG. 1, in some embodiments of the disclosure. The bank of memory 500 includes groups of memory arranged as previously described with reference to FIGS. 3 and 4.

In the example of FIG. 5, the bank of memory 500 includes several groups of memory. Each of the groups of memory includes a plurality of sections of memory. At least one of the groups of memory includes redundant memory that may be used to repair defective memory included in the bank of memory 500. Several of the groups of memory also include memory that are associated with more than one block of memory. Each of the sections may include the same number of rows and columns of memory in some embodiments of the disclosure. In some embodiments of the disclosure, at least one of the sections of memory may include a different number of rows and/or columns of memory.

In the example shown in FIG. 5, the bank of memory 500 includes 16 groups of memory, each including 3 sections of memory. As a result the bank of memory 500 includes 48 sections of memory. The groups of the bank of memory 500 are referenced as Groups 0-15, with each Group including Sections 0-2.

In some embodiments of the disclosure, each of the Sections includes a non-binary number of rows of memory. In the example shown in FIG. 5, it is assumed that each of the Sections includes 1,376 rows of memory. As a result, each Group includes 4,128 rows of memory, and the bank of memory 500 includes 66,048 rows of memory.

The rows of memory of the banks of memory are decoded by row decoder 510. The row decoder 510 may be included in the row decoder 130 of FIG. 1, in some embodiments of the disclosure. Logic circuits of the row decoder 510 decode internal addresses to selectively activate a row or rows of memory corresponding to an address to be accessed (e.g., read operation, write operation, etc.). Sense amplifiers are included in the regions between the Sections (not shown in FIG. 5). The sense amplifiers may have an open digit line architecture in some embodiments of the disclosure. The digit lines may generally correspond to a column of memory of the sections of memory.

At least one of the Groups includes rows of memory that are decoded as associated with a plurality of different blocks of memory. For example, in some embodiments of the disclosure, a Group includes rows of memory associated with a block of memory, and also includes rows of memory associated with another block of memory. The row decoder 510 decodes addresses to access the Group(s) to include rows of memory from more than one block of memory. Additionally, every Group does not include rows of memory that are decoded as rows of redundant memory. For example, in some embodiments of the disclosure, the rows of redundant memory for the bank of memory 500 are included in one of the Groups. In some embodiments of the disclosure, the rows of redundant memory for the bank of memory 500 are included in one of the Sections. The rows of redundant memory may be used to repair defective rows of memory of the bank of memory 500.

The rows of memory of the bank of memory 500 may be accessed by the row decoder 510 as blocks of memory. In the example of FIG. 5, the rows of the bank of memory 500 are accessed as 16 blocks of memory Block 0 through Block 15. Each of the blocks include fewer rows than included in a Group. As previously described, the example bank of memory 500 includes 16 Groups, and each Group includes 4,128 rows of memory. In some embodiments of the disclosure, each Block includes a binary number of rows of memory. For example, each Block 0-15 of FIG. 500 includes 4,096 (4K) rows of prime memory. Fifteen of the Groups include rows of memory that are associated with a corresponding Block (Groups 0-14) and one of the Groups includes rows of memory that are associated with a partial Block (Group 15). The one Group also includes rows of memory that are decoded as redundant memory, for example, 512 rows of redundant memory.

In some embodiments of the disclosure, the Groups of the bank of memory 500 are arranged similarly to Group 300 of FIG. 3 or Group 400 of FIG. 4. For example, rows of memory of Groups 0-14 of the bank of memory 500 may be arranged similarly to Group 300 and rows of memory of Group 15 may be arranged similarly to Group 400. Example arrangements for Group 0 and Group 15 are shown in FIG. 5. Rows of memory 525 correspond to rows of memory 320, rows of memory 530A correspond to rows of memory 330, rows of memory 520 correspond to rows of memory 420, rows of memory 530B correspond to rows of memory 430, and rows of memory 540 correspond to rows of memory 440.

Blocks 0-14 include rows of prime memory arranged as rows of memory 525. Block 15 includes rows of prime memory that are arranged as rows of memory 520 of Group 15 and further includes rows of memory 530A or 530B from each of the Groups 0-15. For example, as previously described, each of Blocks 0-14 include 4,096 rows of prime memory from a respective Group 0-14 (e.g., Block 0 includes 4K rows of prime memory of Group 0, Block 1 includes 4K rows of prime memory from Group 1, and so on). Block 15 includes 4,096 rows arranged as: 3,584 rows of prime memory 520 from Group 15, 32 rows of prime memory 530A from Group 0, 32 rows of prime memory 530A from Group 1, 32 rows of prime memory 530A from Group 2, and so on through 32 rows of prime memory 530B from Group 15. That is, Block 15 includes 3,584+(32×16) =4,096 rows of prime memory, which is the same number of rows of memory as Blocks 0-14.

The addresses for the rows of prime memory of Block 15 may be decoded by the row decoder 510 according to an address sequence. For example, the address sequence may start with the rows of prime memory included in the rows of memory 520, and sequence from a last row of prime memory in the rows of memory 520 to a first row of prime memory in the rows of memory 530 included in Group 0. The address sequence may continue through the rows of memory 530 from each of the Groups thereafter, until reaching a last row of prime memory in the rows of memory 530 included in Group 15. In other embodiments of the disclosure, the addresses for the rows of prime memory of Block 15 may sequence in a different manner.

In the example of FIG. 5, Group 15 further includes rows of memory that, are decoded as rows of redundant memory. The rows of redundant memory are disposed between rows of prime memory. For example, the rows of redundant memory 540 are disposed between the rows of prime memory 520 and rows of prime memory 530. In the present example, the rows of redundant memory 540 include 512 rows of redundant memory. The rows of redundant memory 540 may be used to replace rows of memory for the bank of memory 500. For example, rows of memory of Blocks 0-15 may be replaced with rows of redundant memory included in the rows of redundant memory 540.

In the example of FIG. 5, the rows of redundant memory are included in a Section of the bank of memory 500. As previously described, including the redundant memory for a bank of memory in a section of memory allows for any of the rows of redundant memory to be accessed by activating a common set of sense amplifiers. For embodiments of the disclosure including sense amplifier threshold voltage compensation, such an arrangement may be desirable for reducing power consumption in comparison to having rows of redundant memory spread over many sections/groups of memory, which are accessed by activating many sets of sense amplifiers (e.g., performing concurrent prime memory and redundant memory sense amplifier threshold voltage compensation).

Some embodiments of the disclosure may include placing all redundant elements in one section of memory while supporting a non-binary number of WL's per section (e.g., 1,376 WL's per section). Also, the number of non-sequential address boundaries and prime to redundant boundaries may be reduced and/or minimized. Such embodiments of the disclosure also allow a global row decode layout to be similar from Group to Group. The previously described embodiments are not intended to limit the scope of the disclosure to the particular described embodiments. For example, in some embodiments of the disclosure, a row decoder may decode addresses for a memory bank to include rows of memory that are partitioned into other non-binary amounts (e,g., e.g., 1,272 WL's per section).

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:
1. An apparatus, comprising:
   a memory cell array including a bank of memory, the bank of memory including a plurality of groups of memory, each of the groups of memory including a plurality of sections of memory, each of the sections of memory including memory cells arranged in rows and columns of memory for the respective group; and
   a row decoder coupled to the bank of memory and configured to decode addresses and selectively activate a selected row of memory cells during a memory access operation, the row decoder further configured to decode the addresses to access a first group of memory of the plurality of groups of memory to include rows of prime memory from a first block of memory and to further include rows of prime memory from a second block of memory, and to further decode the addresses to access a second group of memory of the plurality of groups of memory to include rows of prime memory from the second block of memory and to further include rows of redundant memory, wherein the rows of redundant memory are shared with the first and second blocks of memory, wherein the first block of memory includes a fewer number of rows of memory than the first group of memory of the plurality of groups of memory.

2. The apparatus of claim 1 wherein the rows of redundant memory of the second group of memory of the plurality of groups of memory are included in one section of memory of the second group of memory.

3. The apparatus of claim 2, further comprising a set of sense amplifiers coupled to columns of memory of the one section.

4. The apparatus of claim 1 wherein the row decoder is further configured to decode the addresses to access a third group of memory of the plurality of groups of memory to include rows of prime memory from a third block of memory and further includes rows of prime memory from the second block of memory.

5. The apparatus of claim 4 wherein the rows of redundant memory are also shared with the third block of memory.

6. The apparatus of claim 1 wherein the rows of redundant memory of the second group of memory of the plurality of memory are disposed between rows of prime memory for the second block of memory included in the second group of memory.

7. An apparatus, comprising:
a memory cell array including a bank of memory, the bank of memory including a plurality of groups of memory, each of the groups of memory including a plurality of sections of memory, each of the sections of memory including memory cells arranged in rows and columns of memory for the respective group; and
a row decoder coupled to the bank of memory and configured to decode addresses and selectively activate a selected row of memory cells during a memory access operation, the row decoder further configured to decode the addresses to access a first group of memory of the plurality of groups of memory to include rows of prime memory from a first block of memory and to further include rows of prime memory from a second block of memory, and to further decode the addresses to access a second group of memory of the plurality of groups of memory to include rows of prime memory from the second block of memory and to further include rows of redundant memory, wherein the rows of redundant memory are shared with the first and second blocks of memory, wherein the first group of memory for the plurality of groups of memory includes all of the rows of prime memory for the first block of memory and the second group of memory of the plurality of groups of memory includes less than all of the rows for the second block of memory.

8. An apparatus, comprising:
a memory cell array including a plurality of banks of memory and a plurality of sets of sense amplifiers, each of the banks of memory including memory cells arranged in rows and columns of memory, the rows and columns of memory included in a plurality of sections of memory, each set of sense amplifiers of the plurality of sets of sense amplifiers coupled to the columns of memory included in a section of memory of the plurality of sections of memory and each set of sense amplifiers of the plurality of sets of sense amplifiers configured to be activated when accessing a row of memory included in the section of memory that includes the columns of memory to which the set of sense amplifiers are coupled; and
a plurality of row decoders, each configured to decode addresses and selectively activate a selected row of memory cells for access for a respective bank of memory, each row decoder of the plurality of row decoders further configured to access the rows of memory cells as blocks of memory, wherein each of the blocks of memory including rows of memory cells of a portion of at least one section of memory and wherein two different blocks of memory include rows of memory from a same section of memory.

9. The apparatus of claim 8 wherein at least one block of memory includes rows of memory from every section of memory that includes rows of memory for two different blocks of memory.

10. The apparatus of claim 8 wherein each bank of memory of the plurality of banks of memory further include rows of redundant memory, wherein the rows of redundant memory are included in a same section of memory and are configured to repair defective rows of prime memory of the respective bank of memory.

11. The apparatus of claim 10 wherein at least one block of memory includes rows of memory from every section of memory that includes rows of memory for two different blocks of memory, and Wherein a total number of rows for the at least one block from every section of memory that includes rows of memory for two different blocks of memory is equal to a number of rows that may be used as the rows of redundant memory.

12. The apparatus of claim 10 wherein the rows of redundant memory are disposed between rows of prime memory of the same section of memory.

13. The apparatus of claim 8 wherein each of the plurality of sections of memory includes rows of prime memory except for the same section of memory that includes the rows of redundant memory.

14. The apparatus of claim 8 wherein each of the plurality of sections of memory include a non-binary number of rows of memory.

15. The apparatus of claim 14 wherein each of the blocks of memory include a binary number of rows of memory.

16. A method, comprising:
decoding addresses to access rows of prime memory of a bank of memory as blocks of memory, wherein the rows of prime memory are included in sections of memory, each section of memory accessed through a set of sense amplifiers; and
repairing rows of prime memory of the bank of memory by accessing rows of redundant memory shared with the bank of memory and included in a same section of memory,
wherein at least one section of memory includes rows of memory that are decoded as rows of prime memory from two different blocks of memory, and
wherein the same section of memory further includes rows of memory that are decoded as rows of prime memory for one of the two different blocks of memory.

17. The method of claim 16 wherein each of the sections of memory includes a non-binary number of rows of memory.

18. The method of claim 17 wherein the blocks of memory each include a binary number of rows of memory.

19. The method of claim 16 wherein the sections of memory are included in groups of memory, and wherein at least one of the sections of memory for each group of memory includes rows of memory that are decoded as rows of prime memory for the one of the two different blocks of memory.

* * * * *